(12) United States Patent
Ichijo et al.

(10) Patent No.: US 11,432,440 B2
(45) Date of Patent: Aug. 30, 2022

(54) POWER CONVERSION APPARATUS

(71) Applicant: DENSO CORPORATION, Kariya (JP)

(72) Inventors: Hiromi Ichijo, Kariya (JP); Kazuya Takeuchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/782,468

(22) Filed: Feb. 5, 2020

(65) Prior Publication Data

US 2020/0178424 A1    Jun. 4, 2020

Related U.S. Application Data

(63) Continuation of application No. PCT/JP2018/026932, filed on Jul. 18, 2018.

(30) Foreign Application Priority Data

Aug. 9, 2017 (JP) .............................. JP2017-154361

(51) Int. Cl.
*H05K 7/20* (2006.01)
*H02K 9/19* (2006.01)

(52) U.S. Cl.
CPC ........... *H05K 7/20927* (2013.01); *H02K 9/19* (2013.01)

(58) Field of Classification Search
CPC .. H05K 7/20927; H05K 7/1432; H05K 7/209; H05K 7/20263; H05K 7/20509; H05K 7/20; H05K 7/20281; H05K 7/2089; H05K 5/0008; H05K 5/0247; H05K 5/03; H05K 5/061; H05K 7/14; H02K 9/19; H01L 23/473; H01L 23/4006; H01L 2023/4087; H01L 23/367; H01L 23/3675;
(Continued)

(56) References Cited

U.S. PATENT DOCUMENTS 5,455,458 A * 10/1995 Quon .................. H01L 23/4275
                                                  257/714
6,154,369 A * 11/2000 Martinez, Jr. ......... H01L 23/367
                                                  361/719
10,420,256 B1 * 9/2019 Nakamura ......... H05K 7/20254
(Continued)

FOREIGN PATENT DOCUMENTS

JP      2005-245164 A     9/2005
JP      2007-295639 A    11/2007
(Continued)

OTHER PUBLICATIONS

Aug. 21, 2018 International Search Report issued in International Patent Application No. PCT/JP2018/026932.

*Primary Examiner* — Michael A Matey
(74) *Attorney, Agent, or Firm* — Oliff PLC

(57) ABSTRACT

A power conversion apparatus includes an electric component, a housing, and a flow channel formation unit. The electric component configures at least a part of a power conversion circuit. The housing stores the electric component, and the electric component is fixed to the housing. The flow channel formation unit forms a refrigerant flow channel through which a refrigerant flows, and is thermally connected to the electric component. The flow channel formation unit is a member different from the housing, and an elastically deformable spacer is provided between the flow channel formation unit and the housing.

5 Claims, 2 Drawing Sheets

(58) Field of Classification Search
CPC ......... H01L 23/40; H01L 23/46; H01L 24/73; H02M 7/003; G06F 1/20; G06F 2200/201
See application file for complete search history.

(56) References Cited

U.S. PATENT DOCUMENTS

| | | | |
|---|---|---|---|
| 2001/0014029 A1* | 8/2001 | Suzuki | H05K 7/20927 363/141 |
| 2008/0237847 A1* | 10/2008 | Nakanishi | H01L 23/473 257/722 |
| 2010/0208427 A1* | 8/2010 | Horiuchi | H05K 7/20927 361/699 |
| 2011/0188204 A1* | 8/2011 | Horiuchi | H01L 23/473 361/702 |
| 2013/0134572 A1* | 5/2013 | Lenniger | H01L 23/3677 257/690 |
| 2013/0264702 A1* | 10/2013 | Nishi | H01L 23/3735 257/712 |
| 2014/0138075 A1* | 5/2014 | Yang | H01L 23/473 165/185 |
| 2015/0008574 A1* | 1/2015 | Gohara | H01L 23/12 257/714 |
| 2015/0208556 A1* | 7/2015 | Kodama | H05K 7/209 363/123 |
| 2015/0216089 A1* | 7/2015 | Tanaka | H01L 23/473 361/699 |
| 2015/0216090 A1* | 7/2015 | Sakuma | H05K 7/20918 361/697 |
| 2015/0382506 A1* | 12/2015 | Yamada | H01L 23/3735 361/699 |
| 2016/0255745 A1* | 9/2016 | Govindassamy | H05K 13/00 361/715 |
| 2016/0294301 A1* | 10/2016 | Yokoyama | H05K 7/20927 |
| 2016/0295734 A1* | 10/2016 | Ueda | H05K 7/1432 |
| 2016/0343641 A1* | 11/2016 | Hori | H01L 24/11 |
| 2017/0006731 A1* | 1/2017 | Higashi | H05K 7/1432 |
| 2017/0194878 A1* | 7/2017 | Jones | H02M 7/003 |
| 2017/0223859 A1* | 8/2017 | Matsuo | H05K 7/1427 |
| 2017/0271240 A1* | 9/2017 | Inoue | H01L 25/18 |
| 2019/0096787 A1* | 3/2019 | Donnelly | H01L 23/473 |
| 2020/0298568 A1* | 9/2020 | Tatsuta | B41J 2/14 |

FOREIGN PATENT DOCUMENTS

| | | |
|---|---|---|
| JP | 2007-306671 A | 11/2007 |
| JP | 2015-027259 A | 2/2015 |
| WO | 2014/024361 A1 | 2/2014 |

* cited by examiner

POWER CONVERSION APPARATUS

CROSS-REFERENCE TO RELATED APPLICATION

The present application is based on and claims the benefit of priority from earlier Japanese Patent Application No. 2017-154361 filed on Aug. 9, 2017, the description of which is incorporated herein by reference.

BACKGROUND

Technical Field

The present disclosure relates to a power conversion apparatus.

Related Art

A conventional power conversion apparatus includes an electric component such as a capacitor that is included in a power conversion circuit, and a housing that stores the electric component. The housing is formed integrally with a refrigerant flow channel through which a refrigerant flows for cooling the electric component and the like.

SUMMARY

As an aspect of the embodiment, a power conversion apparatus is provided which includes: an electric component that configures at least a part of a power conversion circuit; a housing that stores the electric component, the electric component being fixed to the housing; and a flow channel formation unit that forms therein a refrigerant flow channel through which a refrigerant flows, the flow channel formation unit including an outer wall surface thermally connected to the electric component. The housing has an opening, and the flow channel formation unit is a member different from the housing and is attached to the housing in a manner that covers the opening, and an elastically deformable spacer is provided between the flow channel formation unit and the housing.

DETAILED DESCRIPTION OF THE PREFERRED EMBODIMENTS

A conventional power conversion apparatus includes an electric component such as a capacitor that is included in a power conversion circuit and a housing that stores the electric component. The housing is formed integrally with a refrigerant flow channel through which a refrigerant flows for cooling the electric component and the like. For example, in the power conversion apparatus disclosed in JP 2015-27259 A, a capacitor that constitutes a power conversion circuit is fixed to a housing by being pressed against and closely attached to an outer wall surface of a refrigerant flow channel formed integrally with the housing. This facilitates cooling of the capacitor and enhances heat dissipation.

In the configuration disclosed in JP 2015-27259 A, as described above, the capacitor is pressed against the refrigerant flow channel formed integrally with the housing. Therefore, if the dimensional variation of the capacitor is large, the capacitor receives a large reaction force from the outer wall surface of the refrigerant flow channel and the housing and is subjected to great stress. In order to reduce the generation of such stress, an elastically deformable spacer can be interposed between the capacitor and the outer wall surface of the refrigerant flow channel so that the dimensional variation of the capacitor is absorbed. In order to reliably absorb the dimensional variation of the capacitor, the spacer needs to have a sufficiently large thickness. However, as the thickness of the spacer increases, the heat conductivity between the capacitor and the outer wall surface of the refrigerant flow channel decreases, and the efficiency of cooling the capacitor decreases. Thus, the configuration disclosed in JP 2015-27259 A has room for improvement in enhancing the effect of cooling the electric component.

An object of the present disclosure is to provide a power conversion apparatus capable of absorbing the dimensional variation of an electric component and obtaining a superior cooling effect.

First Embodiment

An embodiment of a power conversion apparatus will be described with reference to FIG. 1.

Figure 1:
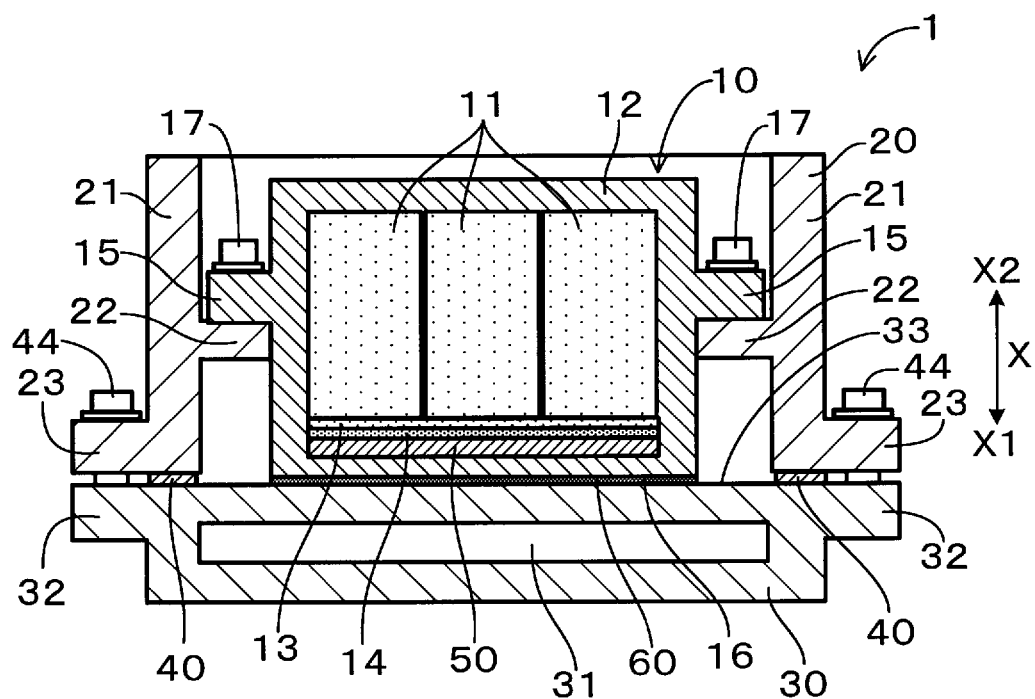
FIG. 1 is a conceptual cross-sectional view of a power conversion apparatus according to the first embodiment.

As illustrated in FIG. 1, the power conversion apparatus 1 according to the present embodiment includes an electric component 10, a housing 20, and a flow channel formation unit 30.

The electric component 10 constitutes at least a part of a power conversion circuit.

The housing 20 stores the electric component 10, and the electric component 10 is fixed to the housing 20.

The flow channel formation unit 30 forms a refrigerant flow channel 31 through which a refrigerant flows, and is thermally connected to the electric component 10.

The flow channel formation unit 30 is a member different from the housing 20, and an elastically deformable spacer 40 is provided between the flow channel formation unit 30 and the housing 20.

Below is a detailed description of the power conversion apparatus 1 according to the present embodiment.

An example of the power conversion apparatus 1 according to the present embodiment has a power conversion function such as an inverter or a converter. The power conversion apparatus 1 can be mounted in an electric car or the like. In FIG. 1, the side on which the flow channel formation unit 30 is provided relative to the housing 20 is referred to as the lower side X1, and the other side is referred to as the upper side X2. The direction between the lower side X1 and the upper side X2 is referred to as the vertical direction X.

The electric component 10 illustrated in FIG. 1 constitutes a part of the power conversion circuit (not illustrated). Note that a plurality of electric components 10 may be provided. The electric component 10 can be, for example, a capacitor, a current sensor, a reactor, a power module, or the like. In the present embodiment, the electric component 10 is a capacitor. The electric component 10 includes a capacitor element 11 and a case 12. The capacitor element 11 includes an electrode 13. In the present embodiment, the electrode 13 is a metallikon electrode formed by spraying melted metal using metallikon. To the electrode 13, a bus bar 50 is connected by a joint member 14 made of solder. Note that the bus bar 50 is connected to an electric component (not illustrated) such as a power module having a semiconductor element.

The material for the case 12 of the electric component 10 can be, but is not limited to, resin. In the present embodiment, the case 12 is made of a polyphenylene sulfide (PPS) resin. As illustrated in FIG. 1, the case 12 contains the capacitor element 11 and has a housing fixing rib 15 to be fixed to the housing 20. In the present embodiment, a part of the bus bar 50 is also located inside the case 12. Note that a lower surface 16 of the case 12 has a planar shape.

As illustrated in FIG. 1, the housing 20 has four side walls 21 and has a substantially tubular shape with openings on the lower side X1 and the upper side X2. The electric component 10 is stored inside the housing 20. A protrusion 22 is provided on the inner surface of the side wall 21 of the housing 20, and the housing fixing rib 15 of the electric component 10 is fixed to the protrusion 22 by a fastening member 17. The housing fixing rib 15, the protrusion 22, and the fastening member 17 together constitute a fixing portion. Consequently, the electric component 10 is attached to the housing 20. A top lid member (not illustrated) is provided on the upper end of the housing 20, and the opening in the housing 20 on the upper side X2 is covered with the top lid member. A flange 23 is formed at the lower end of the housing 20 so that the flow channel formation unit 30 (described later) is attached thereto.

As illustrated in FIG. 1, the flow channel formation unit 30 is formed independently of the housing 20. The refrigerant flow channel 31 is provided inside the flow channel formation unit 30. The refrigerant flow channel 31 has a refrigerant inlet (not illustrated) for supplying a refrigerant to the refrigerant flow channel 31 and a refrigerant outlet (not illustrated) for discharging the refrigerant out of the refrigerant flow channel 31. A flow channel formation unit fixing rib 32 protruding outward is provided at the outer edge of the flow channel formation unit 30. The flow channel formation unit fixing rib 32 is fixed to the flange 23 of the housing 20 via a fastening member 44. In the present embodiment, the flow channel formation unit 30 is attached to the lower end of the housing 20 and covers the opening in the housing 20 on the lower side X1. Consequently, the flow channel formation unit 30 also functions as a lid for the housing 20 on the lower side X1.

As illustrated in FIG. 1, the spacer 40 is interposed between the flow channel formation unit 30 and the housing 20. The spacer 40 is made of an elastically deformable material. In the present embodiment, the spacer 40 is made of a material that can seal the space between the flow channel formation unit 30 and the housing 20. The spacer 40 is provided along the entire circumference of the lower end of the housing 20 to seal the space between the housing 20 and the flow channel formation unit 30, thereby preventing external water or the like from entering the housing 20.

In the present embodiment, as illustrated in FIG. 1, a heatsink 60 is provided between the lower surface 16 of the electric component 10 and an upper surface 33 of the flow channel formation unit 30. Consequently, the electric component 10 and the flow channel formation unit 30 are thermally connected via the heatsink 60. In the present embodiment, the lower surface 16 of the electric component 10 and the upper surface 33 of the flow channel formation unit 30 have planar shapes and are parallel with each other. The heatsink 60 has a sheet-like shape. The shape of the heatsink 60 is not limited to a specific shape, and in the present embodiment is substantially the same as the shape of the lower surface 16 of the electric component 10 in planar view. The thickness of the heatsink 60 is not limited to a specific thickness, but is preferably equal to or less than 1.0 mm, and in the present embodiment is about 0.1 mm. The material for the heatsink 60 can be more heat conductive than the material that forms the flow channel formation unit 30. The heatsink 60 is preferably made of an elastically deformable material.

Next, the effects of the power conversion apparatus 1 according to the present embodiment will be described in detail.

In the power conversion apparatus 1, the flow channel formation unit 30 to which the electric component 10 is thermally connected is formed independently of the housing 20. The elastically deformable spacer 40 is interposed between the housing 20 and the flow channel formation unit 30. Therefore, the relative position between the housing 20 and the flow channel formation unit 30 can be easily changed by elastically deforming the spacer 40. By adjusting the relative position between the housing 20 and the flow channel formation unit 30 in accordance with the dimensional variation of the electric component 10, the dimensional variation of the electric component 10 can be absorbed. Thus, the generation of stress on the electric component 10 can be reduced, and the effect of cooling the electric component 10 can be improved.

In the present embodiment, the heatsink 60 is interposed between the electric component 10 and the flow channel formation unit 30. Consequently, the effect of cooling the electric component 10 can further be improved. Furthermore, in the present embodiment, the heatsink 60 is elastically deformable. Consequently, both the spacer 40 and the heatsink 60 can absorb the dimensional variation of the electric component 10, whereby the dimensional variation of the electric component 10 is reliably absorbed, and the generation of stress on the electric component 10 can further be reduced. Since the spacer 40 is elastically deformable, the heatsink 60 can have a sufficiently small thickness. Thus, the effect of cooling the electric component 10 can be improved.

In the present embodiment, the spacer 40 seals the space between the housing 20 and the flow channel formation unit 30. Consequently, the spacer 40 has both the function of absorbing the dimensional variation of the electric component 10 and the function of sealing the space between the housing 20 and the flow channel formation unit 30, which eliminates the need for a separate seal member and contributes to reducing the number of components.

In the present embodiment, the electric component 10 is a capacitor and includes the capacitor element 11 and the electrode 13 provided on the capacitor element 11, and the bus bar 50 is connected to the electrode 13 by the joint member 14. Even with this configuration, the spacer 40 between the housing 20 and the flow channel formation unit 30 is elastically deformed, so that the generation of stress between the bus bar 50, the joint member 14, the electrode 13, and the capacitor element 11 can be reduced. Consequently, crack generation is prevented, whereby the capacitance of the capacitor can be prevented from decreasing.

Note that another electric component or device may be provided on the lower side X1 of the flow channel formation unit 30. In this case, the electric component or device provided on the lower side X1 of the flow channel formation unit 30 can also be cooled by the refrigerant flowing through the refrigerant flow channel 31.

As described above, the present embodiment can provide a power conversion apparatus 1 capable of absorbing the dimensional variation of the electric component 10 and obtaining a superior cooling effect.

Second Embodiment

Figure 2:
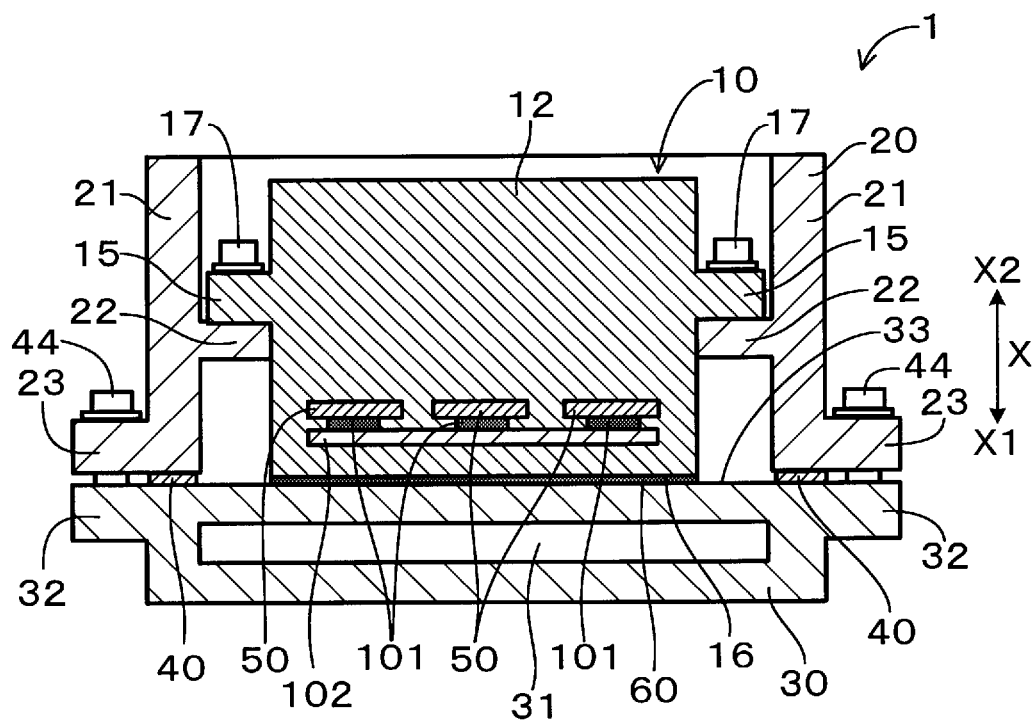
FIG. 2 is a conceptual cross-sectional view of a power conversion apparatus according to the second embodiment.

The power conversion apparatus 1 according to the present embodiment includes a current sensor as an electric component 100 illustrated in FIG. 2, in place of a capacitor as the electric component 10 in the first embodiment illustrated in FIG. 1. The other components are the same as those of the first embodiment, and are denoted by the same reference signs as in the first embodiment. Descriptions of these components are omitted in the present embodiment.

As illustrated in FIG. 2, the electric component 100 is a current sensor and includes a sensor element 101, a substrate 102 provided with the sensor element 101, and the case 12 that holds them. The sensor element 101 is connected to the bus bar 50. In the present embodiment, the substrate 102 and the bus bar 50 are parallel with the lower surface 16 that is in contact with the flow channel formation unit 30 in the electric component 100. Note that the substrate 102 is provided with other electric components (not illustrated) in addition to the sensor element 101 illustrated in FIG. 2.

In the power conversion apparatus 1 according to the present embodiment, like in the first embodiment, the spacer 40 between the housing 20 and the flow channel formation unit 30 is elastically deformed, so that the generation of stress on the substrate 102 and on the electric components such as the sensor element 101 mounted on the substrate 102 can be reduced. Consequently, the electric components such as the sensor element 101 can be prevented from becoming detached from the substrate 102. Note that the present embodiment can achieve the same effects as the first embodiment.

Third Embodiment

Figure 3:
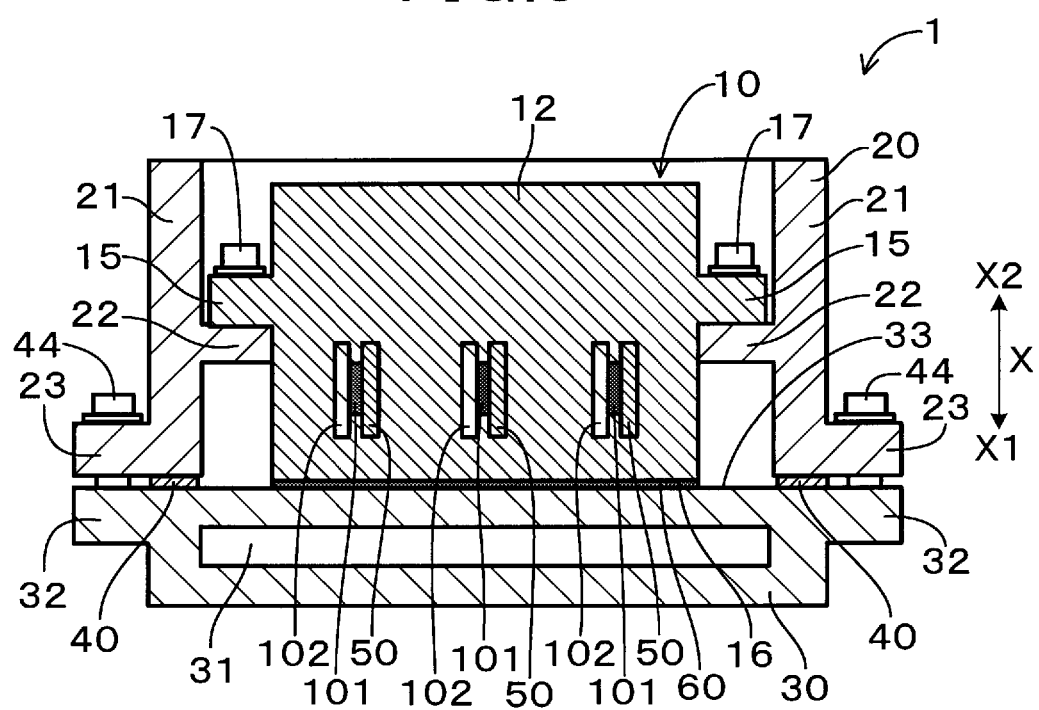
FIG. 3 is a conceptual cross-sectional view of a power conversion apparatus according to the third embodiment.

As illustrated in FIG. 3, the power conversion apparatus 1 according to the present embodiment includes, as the electric component 100, a current sensor different from the current sensor in the second embodiment illustrated in FIG. 2. The other components are the same as those of the first and second embodiments, and are denoted by the same reference signs as in the first and second embodiments. Descriptions of these components are omitted in the present embodiment.

As illustrated in FIG. 3, the electric component 100 is a current sensor, and the substrate 102 and the bus bar 50 are perpendicular to the lower surface 16 that is in contact with the flow channel formation unit 30 in the electric component 100. The present embodiment can achieve the same effects as the second embodiment. Furthermore, in the present embodiment, since the substrate 102 and the bus bar 50 are perpendicular to the lower surface 16, there is a risk of the sensor element 101 and the bus bar 50 becoming misaligned due to vibrations in the vertical direction X. However, the spacer 40 between the housing 20 and the flow channel formation unit 30 is elastically deformed, so that the sensor element 101 and the bus bar 50 can be prevented from becoming misaligned. Thus, the accuracy of detection in the sensor element 101 can be prevented from decreasing.

The present disclosure is not limited to the above embodiments, and can be applied to various embodiments without departing from the gist of the disclosure. If the refrigerant flow channel 31 is unnecessary, a lid member without the refrigerant flow channel 31 may be used instead of the flow channel formation unit 30, whereby the configuration without the refrigerant flow channel 31 can be easily established with the same components as the aforementioned configurations except the flow channel formation unit 30.

The present disclosure has been described with reference to the embodiments, but it is to be understood that the present disclosure is not limited to the embodiments and structures. The present disclosure covers various modifications and equivalent variations. In addition to various combinations and forms, other combinations and forms including one or more/less elements thereof are also within the spirit and scope of the present disclosure.

An aspect of the present disclosure is a power conversion apparatus (1) including:

an electric component (10) that configures at least a part of a power conversion circuit;

a housing (20) that stores the electric component, the electric component being fixed to the housing; and a flow channel formation unit (30) that forms therein a refrigerant flow channel (31) through which a refrigerant flows, the flow channel formation unit including an outer wall surface thermally connected to the electric component, wherein the housing has an opening, and the flow channel formation unit is a member different from the housing and is attached to the housing in a manner that covers the opening, and an elastically deformable spacer (40) is provided between the flow channel formation unit and the housing.

In the above power conversion apparatus, the flow channel formation unit to which the electric component is thermally connected is formed independently of the housing. The elastically deformable spacer is interposed between the housing and the flow channel formation unit. Therefore, the relative position between the housing and the flow channel formation unit can be easily changed by elastically deforming the spacer. By adjusting the relative position between the housing and the flow channel formation unit in accordance with the dimensional variation of the electric component, the dimensional variation of the electric component can be absorbed. Thus, the generation of stress on the electric component can be reduced, and the effect of cooling the electric component can be improved.

As described above, the present disclosure can provide a power conversion apparatus capable of absorbing the dimensional variation of an electric component and obtaining a superior cooling effect.

What is claimed is:

1. A power conversion apparatus comprising:
   an electric component that is a part of a power conversion circuit;
   a housing that stores the electric component, the electric component being fixed to the housing; and
   a flow channel formation unit that is a different member from the housing and has an internal refrigerant flow channel configured to accommodate a refrigerant flow, the flow channel formation unit including an outer wall surface thermally connected to the electric component, the outer wall surface closing the refrigerant flow channel with respect to an inside of the housing;
   an elastically deformable spacer between the flow channel formation unit and the housing; and
   a fixing portion that fixes the electric component and the housing to each other and is located on a plane different from the outer wall surface of the flow channel formation unit;

wherein the flow channel formation unit, the housing, the elastically deformable spacer and a fastener that fastens the flow channel formation unit to the housing are configured such that spacing between the housing and the flow channel formation unit is determined by deformation of the elastically deformable spacer to compensate for dimensional variation of the electronic component.

2. The power conversion apparatus according to claim 1, further comprising:

a heatsink interposed between the electric component and the flow channel formation unit.

3. The power conversion apparatus according to claim 1, wherein the spacer seals a space between the housing and the flow channel formation unit.

4. The power conversion apparatus according to claim 1, wherein the electric component is a capacitor and includes a capacitor element and an electrode on the capacitor element, and a bus bar is connected to the electrode by a joint member.

5. The power conversion apparatus according to claim 1, wherein the electric component is a current sensor and includes a sensor element and a substrate with the sensor element, and a bus bar is connected to the sensor element.

* * * * *